(12) United States Patent
Kirk et al.

(10) Patent No.: US 12,051,548 B2
(45) Date of Patent: *Jul. 30, 2024

(54) LOW INDUCTANCE COMPONENT

(71) Applicant: KYOCERA AVX Components Corporation, Fountain Inn, SC (US)

(72) Inventors: Michael W. Kirk, Simpsonville, SC (US); Marianne Berolini, Greer, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/194,675

(22) Filed: Apr. 3, 2023

(65) Prior Publication Data

US 2023/0238186 A1   Jul. 27, 2023

Related U.S. Application Data

(63) Continuation of application No. 16/850,153, filed on Apr. 16, 2020, now Pat. No. 11,621,129.

(Continued)

(51) Int. Cl.
*H01G 4/38* (2006.01)
*H01G 4/12* (2006.01)
*H01G 4/40* (2006.01)
*H01L 27/08* (2006.01)
*H01L 49/02* (2006.01)

(52) U.S. Cl.
CPC ............ *H01G 4/38* (2013.01); *H01G 4/12* (2013.01); *H01G 4/40* (2013.01); *H01L 27/0805* (2013.01); *H01L 28/60* (2013.01)

(58) Field of Classification Search
CPC .......... H01G 4/232; H01G 4/248; H01G 4/38; H01G 4/12; H01G 4/40; H01G 4/005; H01G 4/30; H01L 28/60; H01L 127/0805
USPC ............ 361/306.3, 308, 321.3, 321.1, 301.4, 361/308.1; 257/532
See application file for complete search history.

(56) References Cited

U.S. PATENT DOCUMENTS 2,137,809 A   11/1938 Rodgers
4,475,143 A   10/1984 Hernandez
(Continued)

FOREIGN PATENT DOCUMENTS

CN   105914036 A   8/2016
EP   2 947 757 A1   11/2015
(Continued)

OTHER PUBLICATIONS

International Search Report and Written Opinion for PCT/US2020/028748, dated Aug. 7, 2020, 11 pages.

*Primary Examiner* — Arun Ramaswamy
(74) *Attorney, Agent, or Firm* — Dority & Manning, P.A.

(57) ABSTRACT

A low inductance component may include a multilayer, monolithic device including a first active termination, a second active termination, at least one ground termination, and a pair of capacitors connected in series between the first active termination and the second active termination. The lead(s) may be coupled with the first active termination, second active termination, and/or the at least one ground termination. The lead(s) may have respective length(s) and maximum width(s). A ratio of the length(s) to the respective maximum width(s) of the lead(s) may be less than about 20.

19 Claims, 12 Drawing Sheets

Related U.S. Application Data (60) Provisional application No. 62/838,421, filed on Apr. 25, 2019.

(56) References Cited

U.S. PATENT DOCUMENTS

| | | |
|---|---|---|
| 4,853,826 A | 8/1989 | Hernandez |
| 5,146,200 A | 9/1992 | Heilmann et al. |
| 5,973,906 A | 10/1999 | Stevenson et al. |
| 6,266,229 B1 | 7/2001 | Naito et al. |
| 6,473,291 B1 | 10/2002 | Stevenson |
| 8,451,580 B2 | 5/2013 | Chung et al. |
| 9,460,855 B2 | 10/2016 | Lee et al. |
| 9,633,786 B2 | 4/2017 | Hattori |
| 10,269,499 B2 | 4/2019 | Lee et al. |
| 10,340,086 B2 | 7/2019 | Lee et al. |
| 11,295,895 B2 | 4/2022 | Kirk et al. |
| 2001/0007522 A1* | 7/2001 | Nakagawa ............... H01G 4/38 361/301.4 |
| 2011/0309895 A1 | 12/2011 | Ahn et al. |
| 2013/0146347 A1 | 6/2013 | McConnell et al. |
| 2015/0287549 A1 | 10/2015 | Park et al. |
| 2015/0364260 A1 | 12/2015 | Lee et al. |
| 2018/0182558 A1 | 6/2018 | Byun et al. |
| 2018/0226194 A1 | 8/2018 | Kirk et al. |
| 2018/0350524 A1* | 12/2018 | Itamochi ................ H01G 4/232 |

FOREIGN PATENT DOCUMENTS

| | | |
|---|---|---|
| JP | H 02240907 A | 9/1990 |
| JP | H 07249541 A | 9/1995 |
| JP | 2000299249 A | 10/2000 |
| KR | 20100066080 A | 6/2010 |
| WO | WO 2018/043397 A1 | 3/2018 |
| WO | WO 2018/144987 A1 | 8/2018 |

* cited by examiner

LOW INDUCTANCE COMPONENT

CROSS REFERENCE TO RELATED APPLICATION

The present application is a continuation of U.S. application Ser. No. 16/850,153 having a filing date of Apr. 16, 2020, which claims filing benefit of U.S. Provisional Patent Application Ser. No. 62/838,421 having a filing date of Apr. 25, 2019, which are incorporated herein by reference in their entirety.

BACKGROUND OF THE SUBJECT MATTER

For some time, the design of various electronic components has been driven by a general industry trend toward miniaturization, as well as increased functionality. Multilayer ceramic devices, such as multilayer ceramic capacitors or varistors, are sometimes constructed with a plurality of dielectric-electrode layers. During manufacture, the layers may be pressed and formed into a vertically stacked structure. Multilayer ceramic devices can include a single capacitor or multiple capacitors. Such devices can be provided with lead wires for connection with other electrical components. Lead wires, however, exhibit self-inductance that undesirably increases the overall inductance of the component.

SUMMARY OF THE SUBJECT MATTER

In accordance with one embodiment of the present invention, a low inductance component may include a multilayer, monolithic device including a first active termination, a second active termination, at least one ground termination, and a pair of capacitors connected in series between the first active termination and the second active termination. The lead(s) may be coupled with the first active termination, second active termination, and/or the at least one ground termination. The lead(s) may have respective length(s) and maximum width(s). A ratio of the length(s) to the respective maximum width(s) of the lead(s) may be less than about 20.

In accordance with another embodiment of the present invention, a method for forming a low inductance component may include providing a multilayer, monolithic device body including electrodes that form a pair of capacitors; forming a first active termination, a second active termination, and at least one ground termination external to the multilayer, monolithic device body such that the pair of capacitors are connected in series between the first active termination and the second active termination; and connecting at least one lead with the at least one of the first active termination, second active termination, or the at least one ground termination, wherein the at least one lead has a length and a maximum width, and wherein a ratio of the length to the width of the at least one lead is less than about 20.

Other features and aspects of the present invention are discussed in greater detail below.

BRIEF DESCRIPTION OF THE DRAWINGS

A full and enabling disclosure of the presently disclosed subject matter, including the best mode thereof, directed to one of ordinary skill in the art, is set forth in the specification, which makes reference to the appended figures, in which.

Repeat use of reference characters throughout the present specification and appended drawings is intended to represent same or analogous features, elements, or steps thereof.

DETAILED DESCRIPTION OF THE SUBJECT MATTER

Reference now will be made in detail to various embodiments of the invention, one or more examples of which are set forth below. Each example is provided by way of explanation of the invention, not limitation of the invention. In fact, it will be apparent to those skilled in the art that various modifications and variations may be made in the present invention without departing from the scope or spirit of the invention. For instance, features illustrated or described as part of one embodiment, may be used on another embodiment to yield a still further embodiment. Thus, it is intended that the present invention covers such modifications and variations as come within the scope of the appended claims and their equivalents.

Generally speaking, the present invention is directed to a low inductance component. The low inductance component may include one or more capacitors. Without intending to be limited by theory, a capacitor is an electrical component that stores electrical energy in an electric field. In some embodiments, the component may also include a discrete varistor connected with the one or more capacitors. Without intending to be limited by theory, a varistor is an electrical component that has an electrical resistance that can vary with the applied voltage, thereby rendering it a voltage-dependent resistor.

The component may include one or more leads configured to exhibit low inductance. Low inductance may be highly desirable in certain applications. For example, aspects of the present disclosure may be particularly useful for automotive applications, such as motor start-stop applications.

The low inductance lead(s) may be coupled with a first active termination, a second active termination, and/or a ground termination of the component. The lead(s) may have respective length(s) and maximum width(s). A ratio of the length(s) to the respective maximum width(s) of the lead(s) may be less than about 50, in some embodiments less than about 30, in some embodiments less than about 20, in some embodiments less than about 15, in some embodiments less than about 10, in some embodiments less than about 8, in some embodiments less than about 5, in some embodiments less than about 4, and in some embodiments less than about 2.

The lead(s) may have a variety of suitable cross sectional shapes. For example, one or more of the leads may have an approximately rectangular cross section. The approximately rectangular cross section may have a maximum width in a first direction and a minimum width in a second direction that is perpendicular to the first direction. A ratio of the maximum width to the minimum width may be greater than about 2, in some embodiments greater than about 3, in some embodiments greater than about 4, in some embodiments greater than about 5, in some embodiments greater than about 8, in some embodiments greater than about 10, in some embodiments greater than about 20, in some embodiments greater than 50, and in some embodiments greater than 100. In other embodiments, however, the lead(s) may have cross sectional shapes that are circular, ovular, polygonal, or any other suitable shape.

In some embodiments, one or more of the lead(s) may comprise a plurality of elongated conductive members that are woven, braided, or otherwise arranged together to form the leads.

The above features may result in a low inductance component, which can include one or more capacitors. For example, a first capacitor and a second capacitor can be arranged in a split feedthrough type construction relative to a first active termination, a second active termination, and at least one ground termination. The first and second capacitors can be formed by internal electrodes separated by dielectric layers.

In some embodiments, a discrete varistor can be coupled to the multilayer, monolithic device to form a low inductance integrated component with both a capacitor function and a varistor function. The discrete varistor can include a first external varistor termination connected with the first active termination and a second external varistor termination connected with the second active termination of the multilayer capacitor. For example, the discrete varistor and the multilayer capacitor can be stacked to form a single monolithic component. In combination, the capacitor and varistor can provide low inductance filtering and EMI and/or EMI/ESD circuit protection in a single package, which may be especially useful when space is limited. Furthermore, integrating capacitor and varistor functionality in a single component provides reduced inductance in comparison with two separate components, which would each exhibit its own respective parasitic inductance (e.g., caused by respective leads).

In some embodiments, the leads can be connected with the external terminals and/or the component can be over-molded. Thus, an over-molded layer can encapsulate the discrete varistor and the multilayer, monolithic capacitor device. The over-molded layer can protect the component against damage, for example, by impact or moisture.

As indicated above, the first and second capacitors may be arranged in a split feedthrough type configuration. For example, a first plurality of electrode layers may be disposed within the body and connected with the first active termination. A second plurality of electrode layers disposed within the body and connected with the second active termination. A third plurality of electrode layers can be connected with the ground termination(s) and capacitively coupled with each of the first plurality of electrode layers and second plurality of electrode layers (e.g., in a split feedthrough type arrangement). The first capacitor can be formed at a first overlapping area between the first plurality and third plurality of electrode layers. The second capacitor can be formed at a second overlapping area between the second plurality and third plurality of electrode layers.

In one embodiment, the first capacitor may have a first capacitance, and the second capacitor may have a second capacitance. In some embodiments, the first and second overlapping areas may be approximately equal such that the second capacitance may be approximately equal to the first capacitance. In other embodiments, however, the first and second overlapping areas may be different such the first capacitance may be greater than or less than the second capacitance.

For example, at least one of the first capacitance of the second capacitance may range from about 10 nF to about 3 μF, in some embodiments from about 200 nF to about 2 μF, in some embodiments from about 400 nF to about 1.5 μF. The second capacitance may range from about 5% to about 500% of the first capacitance, in some embodiments from about 10% to about 300%, in some embodiments from about 25% to about 200%, and in some embodiments from about 50% to about 150%.

In some embodiments, the third plurality of electrode layers can generally be cross-shaped and can be connected with a pair of opposing ground terminals. For example, the third plurality of electrode layers can each include a pair of opposite edges. One of the opposite edges can be connected with the first ground termination, and the other of the opposite edges can be connected with the second ground termination.

The multilayer, monolithic capacitor device may be free of any additional capacitors formed within the monolithic body. For example, the first, second, and third pluralities of electrodes may be arranged in an electrode stack-up that extends through a large portion of a thickness of the monolithic body. For example, a ratio of a thickness of the electrode stack-up to a thickness of the monolithic body may range from about 0.5 to about 0.97, in some embodiments from about 0.6 to about 0.95, and in some embodiments from about 0.7 to about 0.9.

In general, the dielectric layers of the multilayer, monolithic device can be made of any material generally employed in the art. For instance, the dielectric layer can be made of a ceramic material including a titanate as a primary component. The titanate may include but is not limited to, barium titanate ($BaTiO_3$). The ceramic material may also contain an oxide of a rare-earth metal and/or a compound of such acceptor type element as Mn, V, Cr, Mo, Fe, Ni, Cu, Co, or the like. The titanate may also contain MgO, CaO, $Mn_3O_4$, $Y_2O_3$, $V_2O_5$, ZnO, $ZrO_2$, $Nb_2O_5$, $Cr_2O_3$, $Fe_2O_3$, $P_2O_5$, SrO, $Na_2O$, $K_2O$, $Li_2O$, $SiO_2$, $WO_3$ or the like. The ceramic material may also include other additives, organic solvents, plasticizers, binders, dispersing agents, or the like in addition to ceramic powder.

In general, the internal electrodes of the multilayer, monolithic device can be made of any material generally employed in the art. For instance, the internal electrodes can be formed by sintering a conductive paste whose main component is a noble metal material. These materials can include, but are not limited to, palladium, palladium-silver alloy, nickel, and copper. For instance, in one embodiment, the electrodes may be made of nickel or a nickel alloy. The alloy may contain one or more of Mn, Cr, Co, Al, W and the like, and a Ni content in the alloy is preferably 95% by weight or more. The Ni or Ni alloy may contain 0.1% by weight or less of various micro-amount components such as P, C, Nb, Fe, Cl, B, Li, Na, K, F, S and the like.

The ceramic body of the multilayer, monolithic device can be formed using any method generally known in the art. For instance, the ceramic body can be formed by forming a laminated body with alternately stacked ceramic sheets and patterned internal electrodes, removing a binder off the laminated body, sintering the binder removed laminated body in a non-oxidative atmosphere at a high temperature ranging from 1200° C. to 1300° C., and re-oxidizing the sintered laminated body in the oxidative atmosphere.

In general, the varistor may be configured to divert electrical surges to ground. For example, the varistor may have a clamping voltage that ranges from about 3 volts to about 150 volts, in some embodiments from about 5 volts to about 100 volts, in some embodiments from about 10 volts to about 50 volts, and in some embodiments from about 15 volts to about 30 volts.

The varistor can include a ceramic body with external electrodes. The ceramic body is fabricated by sintering a laminated body formed of alternately stacked ceramic layers and internal electrodes. Each pair of neighboring internal electrodes faces each other with a ceramic layer therebetween and can be electrically coupled to different external electrodes, respectively.

In general, the dielectric layers may include any suitable dielectric material, such as, for instance, barium titanate, zinc oxide, or any other suitable dielectric material. Various additives may be included in the dielectric material, for example, that produce or enhance the voltage-dependent resistance of the dielectric material. For example, in some embodiments, the additives may include oxides of cobalt, bismuth, manganese, or a combination thereof. In some embodiments, the additives may include oxides of gallium, aluminum, antimony, chromium, boron, titanium, lead, barium, nickel, vanadium, tin, or combinations thereof. The dielectric material may be doped with the additive(s) ranging from about 0.5 mole percent to about 3 mole percent, and in some embodiments from about 1 mole percent to about 2 mole percent. The average grain size of the dielectric material may contribute to the non-linear properties of the dielectric material. In some embodiments, the average grain size may range from about 10 microns to 100 microns, in some embodiments, from about 20 microns to 80 microns. The varistor may also include two terminals, and each electrode may be connected with a respective terminals. Electrodes may provide resistance along the length of the electrodes and/or at the connection between the electrodes and terminals.

In general, the internal electrodes can be made of any material generally employed in the art. For instance, the internal electrodes can be formed by sintering a conductive paste whose main component is a noble metal material. These materials can include, but are not limited to, palladium, palladium-silver alloy, silver, nickel, and copper. For instance, in one embodiment, the electrodes may be made of nickel or a nickel alloy. The alloy may contain one or more of Mn, Cr, Co, Al, W and the like, and a Ni content in the alloy is preferably 95% by weight or more. The Ni or Ni alloy may contain 0.1% by weight or less of various micro-amount components such as P, C, Nb, Fe, Cl, B, Li, Na, K, F, S and the like.

The component may have a variety of sizes. For example, the component may have a case size ranging from EIA 0504, or smaller to EIA 2920, or larger. Example case sizes include 0805, 1206, 1806, 2020, etc.

Figure 1A:
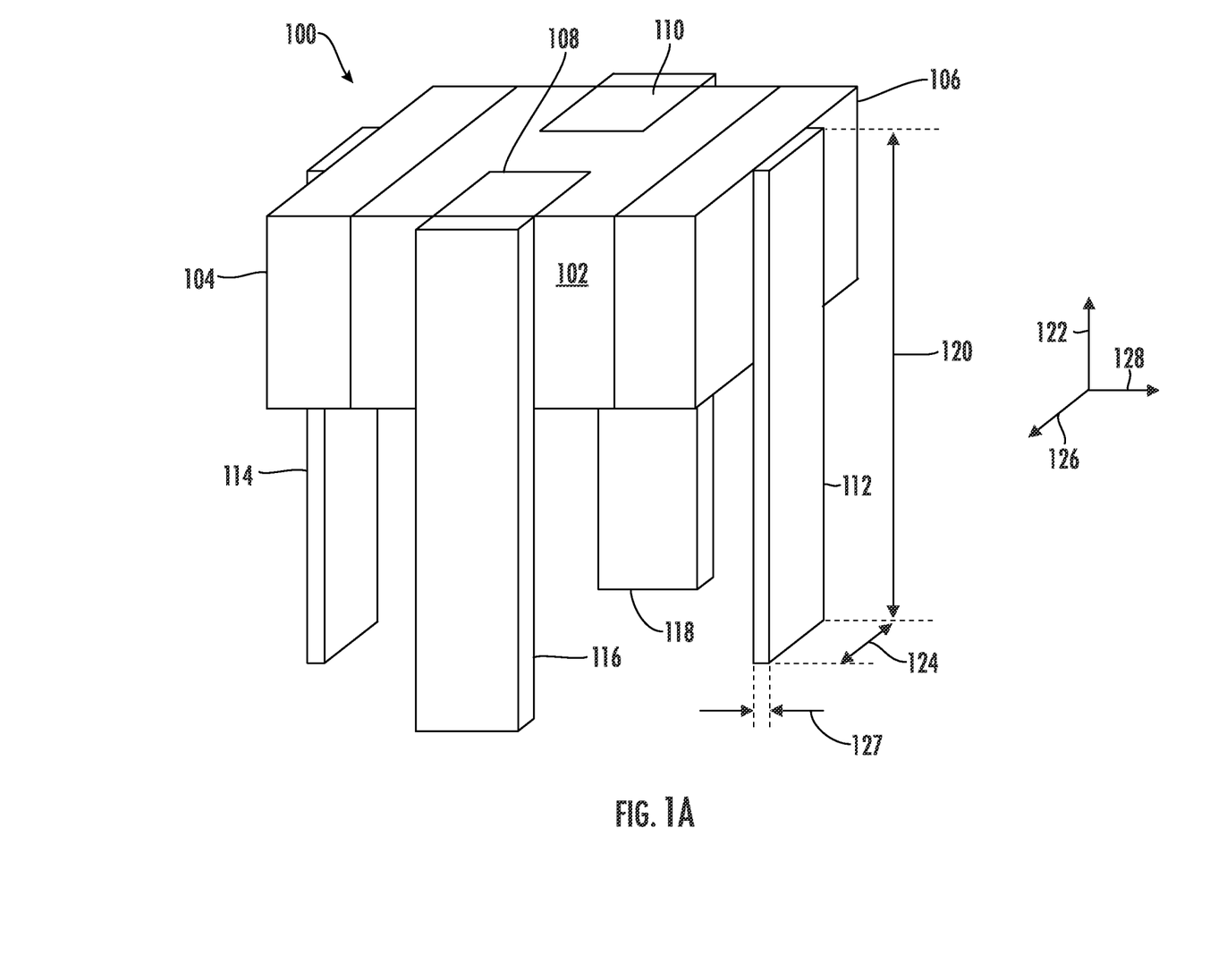
FIG. 1A illustrates an external perspective view of an exemplary embodiment of a low inductance component including leads in accordance with presently disclosed subject matter.

Example embodiments will now be discussed with reference to the Figures. FIG. 1A illustrates an external perspective view of an exemplary embodiment of a low inductance component 100 generally in accordance with presently disclosed subject matter. As illustrated, the component 100 may include a body 102, such as a six-sided body. The component 100 may include a first active termination 104, a second active termination 106, a first ground termination 108, and a second ground termination 110.

A first active lead 112 and a second active lead 114 may be respectively connected with the first active termination 104 and the second active termination 106. A first ground lead 116 and a second ground lead 118 may be respectively connected with the first ground termination 108 and the second ground termination 110.

One or more of the leads 112, 114, 116, 118 may have a length and a maximum width. A ratio of the length to the maximum width of the at least one lead may be less than about 20. For example, the first active lead 112 may have a length 120 in a Z-direction 122, a maximum width 124 in an X-direction 126, and a minimum width 127 in a Y-direction 128. A ratio of the maximum width 124 to the minimum width 127 may be greater than about 2. The first active lead 112 may have an approximately rectangular cross sectional shape, for example, the first active lead 112 may be generally flattened or ribbon shaped. In some embodiments, a ratio of a length to a maximum width of one or more of the leads 112, 114, 116, 118 may be less than about 20. In some embodiments each lead may have respective lengths and widths having respective ratios therebetween that are less than about 20.

Figure 1B:
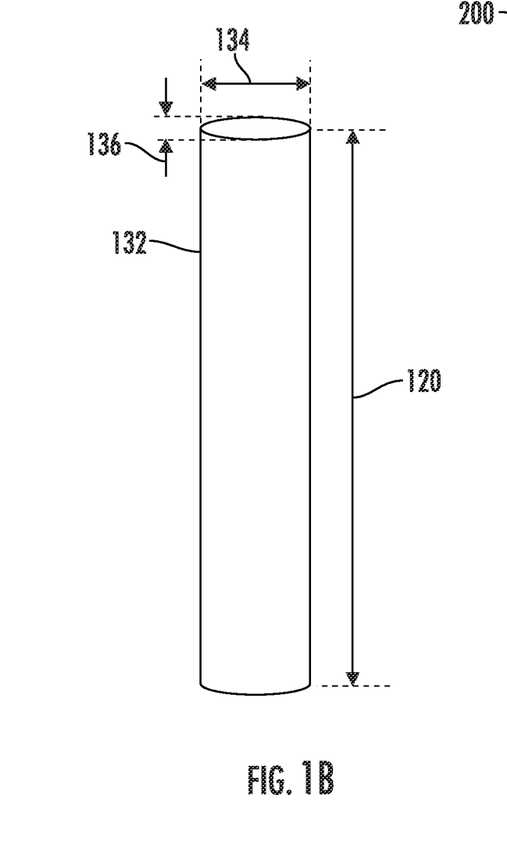
FIG. 1B illustrates another embodiment of a lead of the device of FIG. 1A according to aspects of the present disclosure.
Figure 1C:
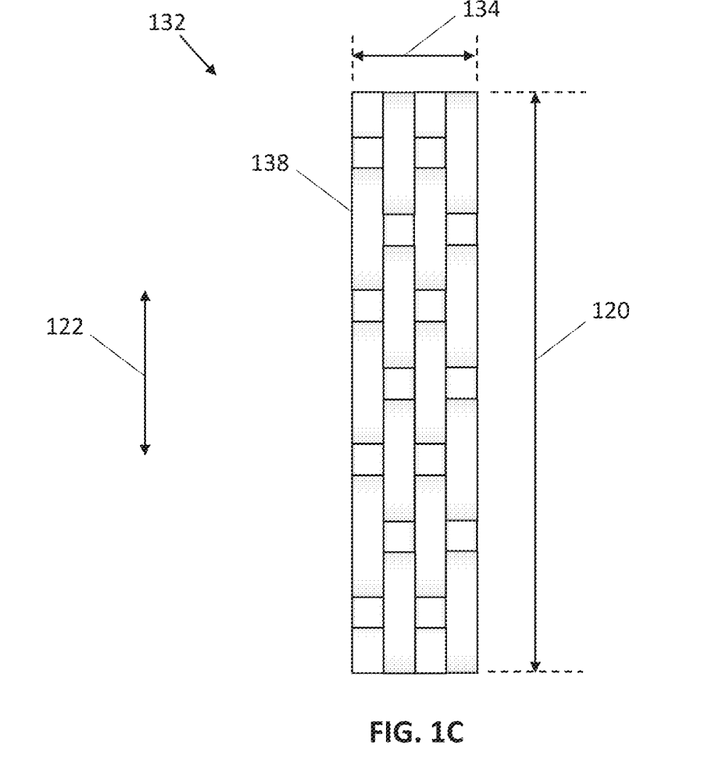
FIG. 1C illustrates still another embodiment of a lead of the device of FIG. 1A according to aspects of the present disclosure.

FIG. 1B illustrates another embodiment of a lead 132 according to aspects of the present disclosure. The lead 132 may have a generally circular or ovular cross sectional shape. The lead 132 may have a maximum width 134 and minimum width 136. In other embodiments, the leads may comprise a plurality of elongated woven conductive members 138, such as schematically illustrated in FIG. 1C.

Figure 2:
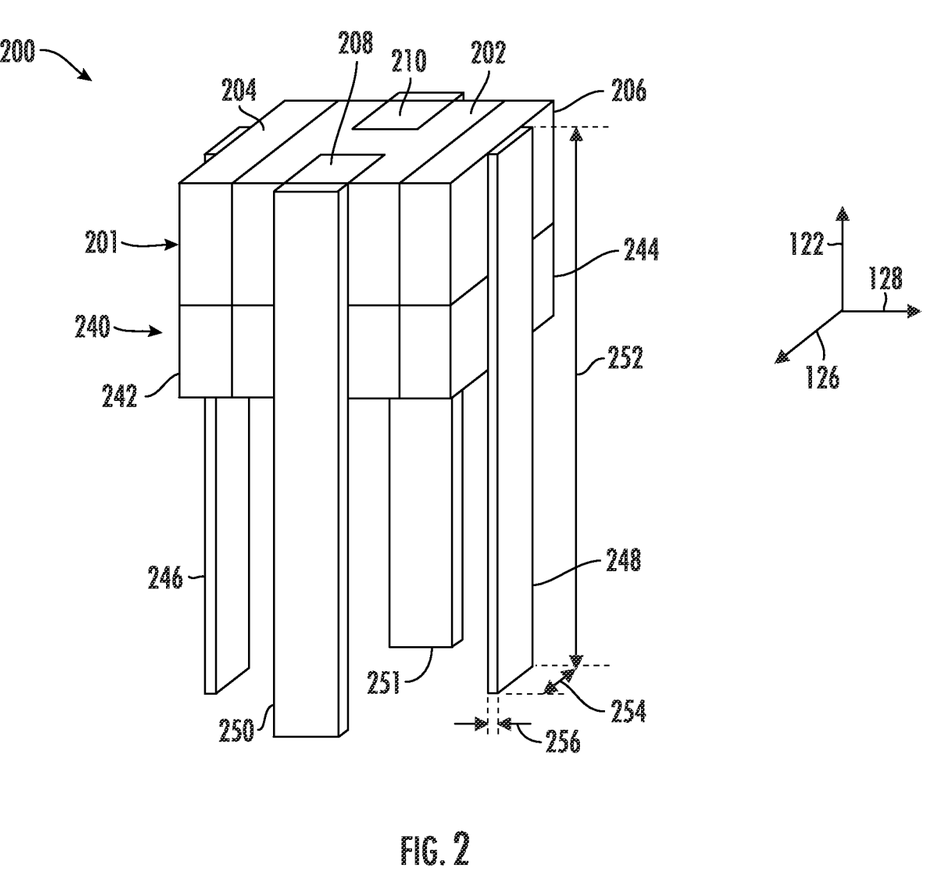
FIG. 2 illustrates an external perspective view of another embodiment of a low inductance component including a discrete varistor in accordance with the presently disclosed subject matter.

FIG. 2 illustrates an external perspective view of another embodiment of a component 200 in accordance with the presently disclosed subject matter. The component 200 may include a multilayer, monolithic device 201, which may include a body 202, such as a six-sided body, a first active termination 204, a second active termination 206, a first ground termination 208, and a second ground termination 210, for example as described above with reference FIG. 1A.

The component 200 may include a discrete varistor 240 having a first external varistor termination 242 and a second external varistor termination 244. The component 200 may include a first active lead 246 coupled with each of the first active termination 204 of the multilayer, monolithic capacitor device 201 and the first external varistor termination 242. The component 200 may include a second active lead 248 coupled with each of the second active termination 206 of the multilayer, monolithic capacitor device 201 and the second external varistor termination 244.

One or more of the leads 246, 248, 250, 251 may have a length and a maximum width, for example as described above with reference to FIG. 1A. A ratio of the length to the maximum width of one or more of the leads 246, 248, 250, 251 may be less than about 20. For example, referring to FIG. 2, the first active lead 248 may have a length 252 in the Z-direction 122, a maximum width 254 in the X-direction 126, and a minimum width 256 in the Y-direction 128. A ratio of the maximum width 254 to the minimum width 256 may be greater than about 2. The first active lead 248 may have an approximately rectangular cross sectional shape. For example, the first active lead 248 may be generally flattened (e.g., ribbon shaped). In some embodiments, each of the leads 246, 248, 250, 251 may have a respective length that is at least 20 times greater than the respective maximum width of the lead 246, 248, 250, 251.

The low inductance component 100 of FIG. 1A and/or multilayer multilayer, monolithic capacitor device 201 of FIG. 2 may include two capacitors formed in series between the first and second terminals, for example as described herein. As understood by those of ordinary skill in the art relative to all embodiments described herein, cooperating layers in the subject multilayer constructions comprise electrode layers which in turn form integrated capacitive structures.

Figure 3A:
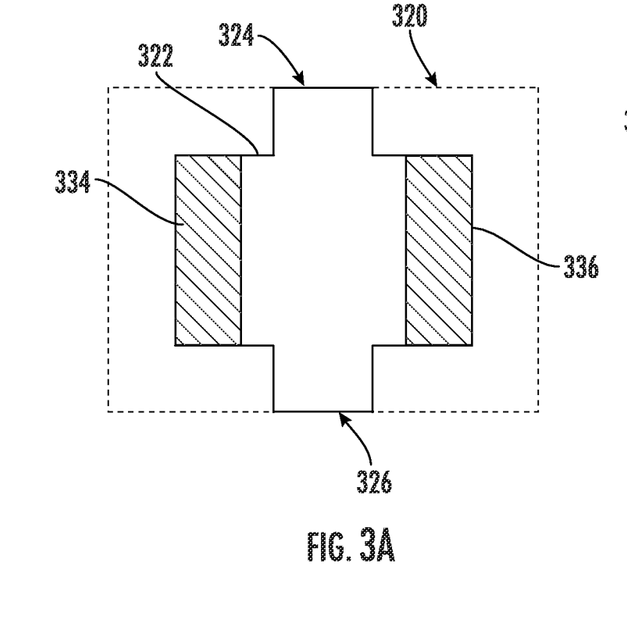
FIGS. 3A and 3B illustrate, respectively, a first electrode layer and a second electrode layer of the component of FIG. 1A according to aspects of the presently disclosed subject matter.
Figure 3B:
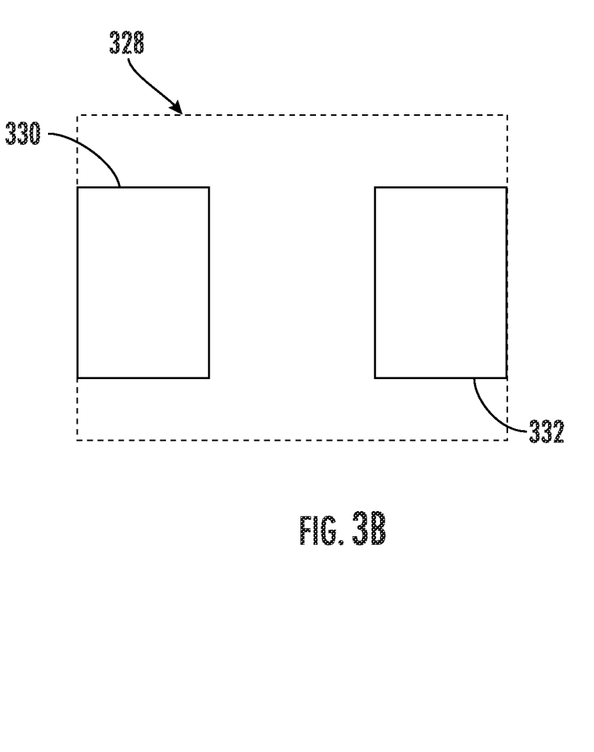
Figure 3C:
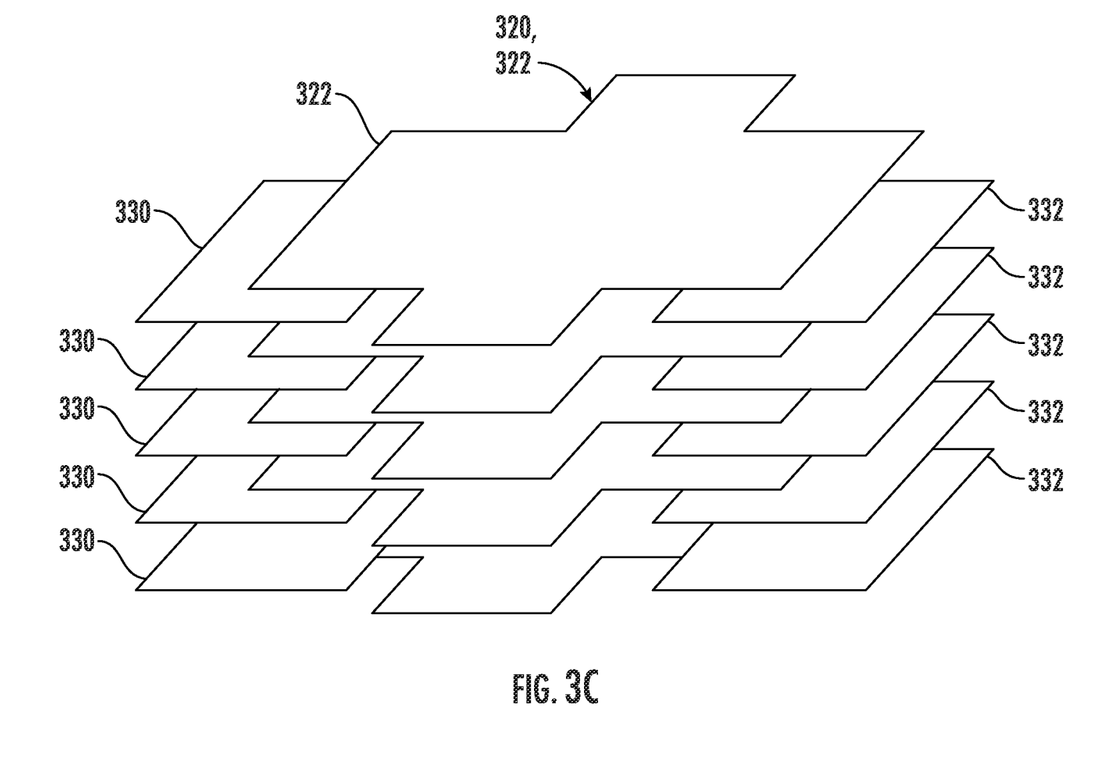
FIG. 3C illustrates an electrode stack-up including the first electrode layer of FIG. 3A and the second electrode layer of FIG. 3B.

FIG. 3A illustrates a first electrode layer 320. The first electrode layer 320 will be described with reference to the component 100 of FIG. 1A. However, it should be understood that the multilayer, monolithic capacitor device 201 of FIG. 2 may be similarly configured. The first electrode layer 320 may include a cross-shaped electrode 322 having a pair of opposite edges 324, 326 respectively connected with the first and second ground terminations 108, 110 of the component 100 of FIG. 1A. FIG. 3B illustrates a second electrode layer 328 including a first electrode 330 connected with the first active termination 104 (FIG. 1A) and a second electrode 332 connected with the second active termination 106 (FIG. 1A). FIG. 3C illustrates a stack-up of alternating first and second electrode layers 320, 328.

Figure 3D:
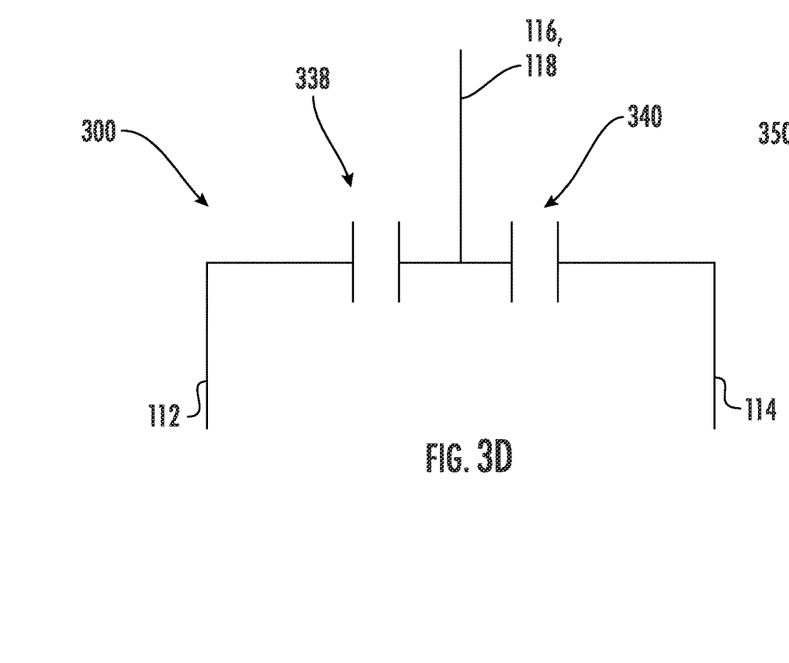
FIG. 3D illustrates a schematic view of the device of FIG. 1A.

FIG. 3D illustrates a schematic view 300 of the device 100 of FIG. 1A. The device 100 can provide a single device solution for containing series and parallel capacitors. The device 100 may include a first capacitor 338 and a second capacitor 340. Referring again to FIGS. 3A and 3B, the first capacitor 338 may be formed between the cross-shaped electrode 322 and the first electrode 330 at the first overlapping area 334. The second capacitor 356 may be formed between the cross-shaped electrode 322 and the second electrode 332 at the second overlapping area 336. The first overlapping area 334 may be approximately equal to the second overlapping area 336 such that the first capacitor and second capacitor exhibit approximately equal capacitances. In other embodiments, however, the first overlapping area 334 may be greater than or less than the second overlapping area 336 such that the first capacitance may be greater than or less than the second capacitance. One or both of the first capacitance and the second capacitance may range from about 10 nF to about 3 µF.

The first active lead 112 may be connected with the first capacitor 338 (e.g., via the first active termination 104 shown in FIG. 1). The second active lead 114 may be connected with the second capacitor 340 (e.g., via the second active termination 106 shown in FIG. 1). The first and second ground leads 116, 118 may be connected at a location between the first and second capacitors 338, 340 in a split feedthrough configuration. For example, the first and second ground leads 116, 118 may be respectively connected with the ground terminations 180, 110 (FIG. 1A).

Figure 3E:
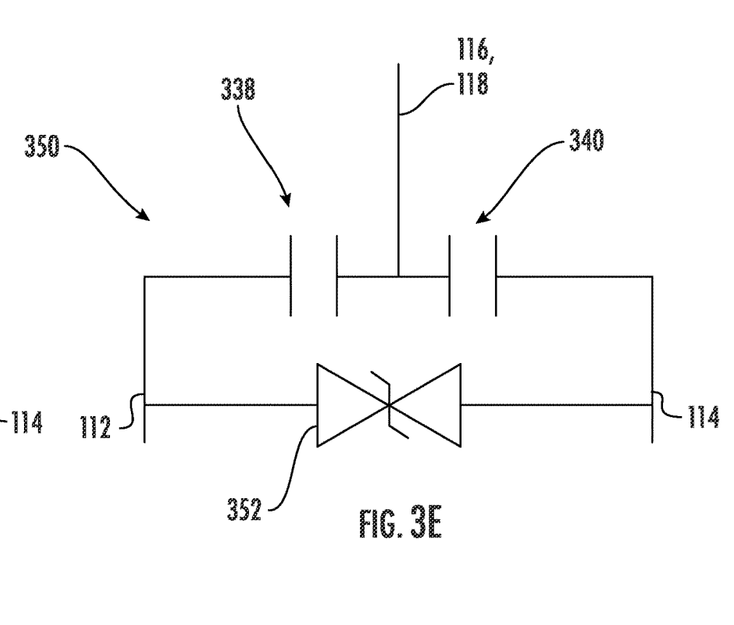
FIG. 3E illustrates a schematic view of the device of FIG. 2.

FIG. 3E illustrates a schematic view 350 of the device 200 of FIG. 2. A varistor 352 may be electrically connected between the active leads 112, 114.

Figure 4A:
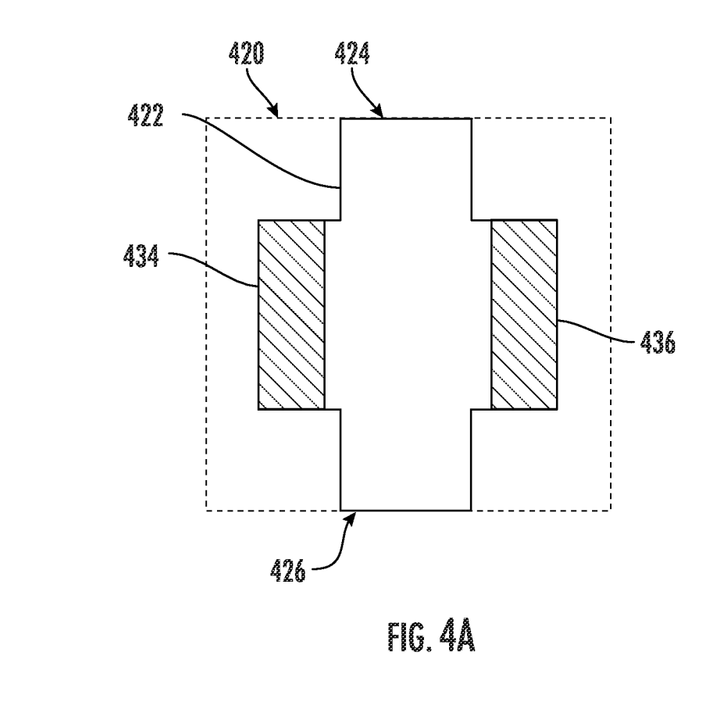
FIGS. 4A and 4B illustrate, respectively, a first electrode layer and a second electrode layer of an electrode configuration of another embodiment of a low inductance component according to aspects of the present disclosure.
Figure 4B:
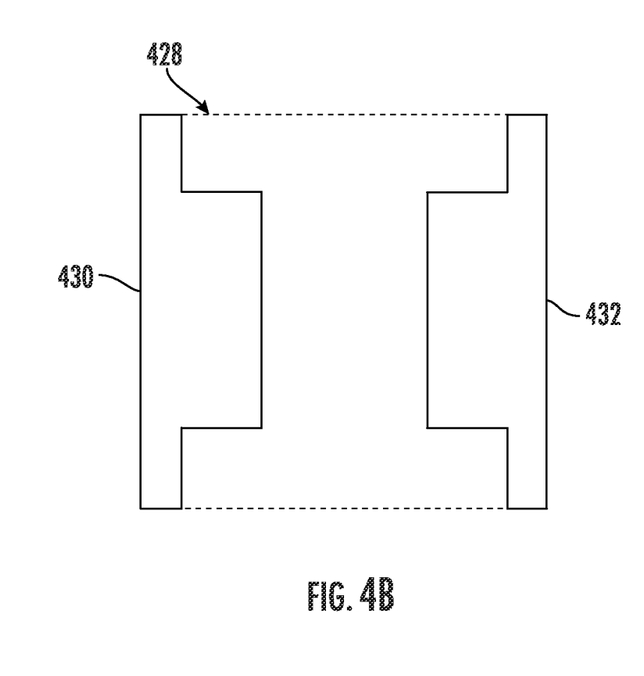
Figure 4C:
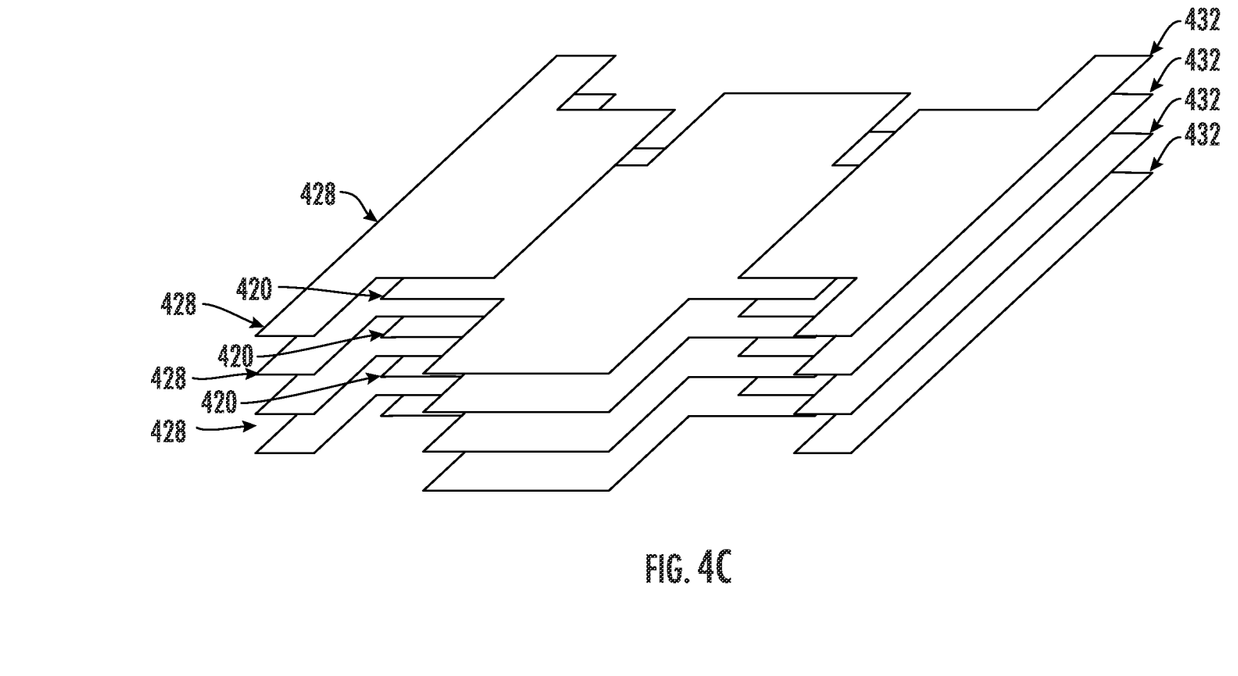
FIG. 4C illustrates an electrode stack-up including the first electrode layer of FIG. 4A and the second electrode layer of FIG. 4B.

FIGS. 4A and 4B illustrate an electrode configuration of another embodiment of a multilayer capacitor according to aspects of the present disclosure. Referring to FIG. 4A, a first electrode layer 420 may include a cross-shaped electrode 222 having a pair of opposite edges 424, 426 that may be respectively connected with the first and second ground terminations 108, 110 (FIG. 1A). FIG. 4B illustrates a second electrode layer 428 including a first electrode 430 connected with the first active termination 104 and a second electrode 432 connected with the second active termination 106. FIG. 4C illustrates a stack-up of alternating first and second electrode layers 420, 428. Referring again to FIG. 4A, the cross-shape electrode 422 may overlap with the first electrode 430 along a first overlapping area 434 to form a first capacitor 438 and may overlap with the second electrode 432 along a second overlapping area 436 to form a second capacitor 440.

Figure 5A:
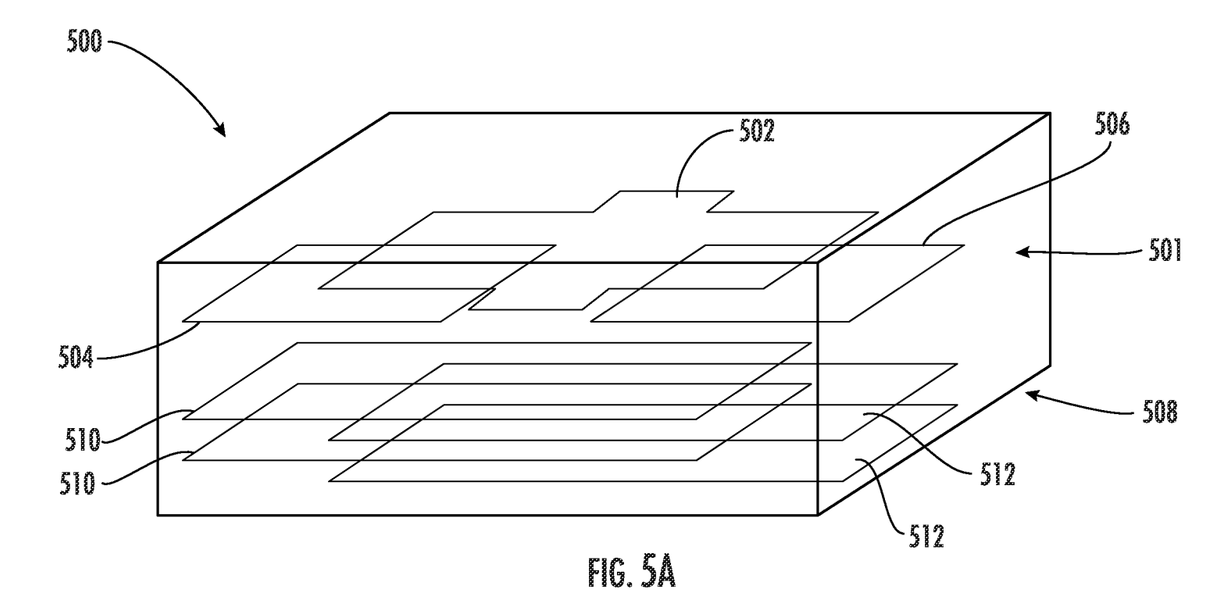
FIG. 5A illustrates an additional electrode configuration including an additional capacitor as compared with the electrode configurations described above with reference to FIGS. 3A through 4C.
Figure 5B:
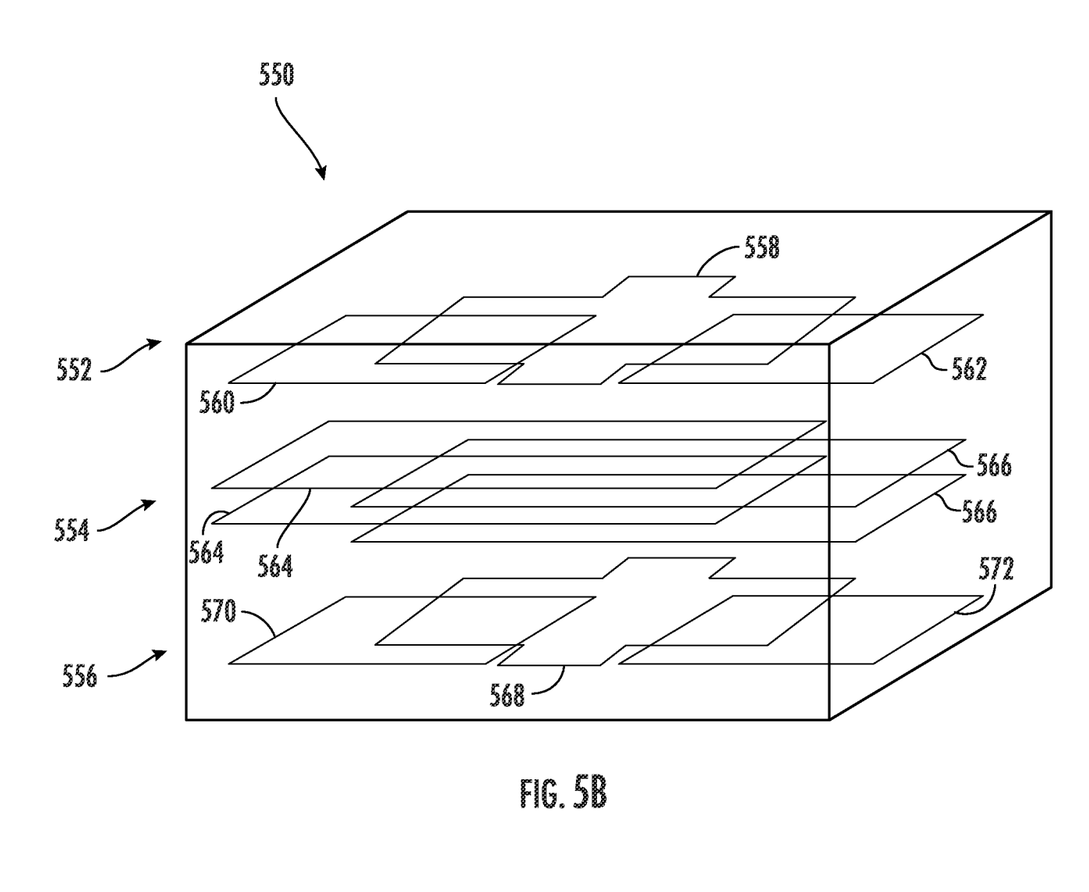
FIG. 5B illustrates another additional electrode configuration including additional capacitors as compared with the electrode configurations described above with reference to FIGS. 3A through 4C.

FIGS. 5A and 5B illustrate respective additional electrode configurations including additional capacitors with respect to the electrode configurations described above with reference to FIGS. 3A through 4C. The electrode configurations of FIGS. 5A and 5B will be described with reference to the component 100 of FIG. 1A. However, it should be understood that the multilayer, monolithic capacitor device 201 of FIG. 2 may be similarly configured. Referring to FIG. 5A, a first electrode configuration 500 may include a first region 501 and a second region 508. The first region may include a cross-shaped electrode 502, a first electrode 504, and a second electrode 506, for example as described above with reference to FIGS. 3A through 3C.

The second region 508 may include a third capacitor formed by a plurality of third electrodes 510 interleaved with a plurality of fourth electrodes 512. The third electrodes 510 may be connected with the first active termination 104 (FIG. 1A), and the fourth electrodes 512 may be connected with the second active termination 106 (FIG. 1A).

FIG. 5B illustrates a second electrode configuration 550 including a first region 552, second region 554, and third region 556. The first region 552 may include an electrode stack-up including one or more cross-shaped electrodes 558, one or more first electrodes 560, and one or more second electrodes 562, for example as described above with reference to FIGS. 3A through 3C.

The second region 554 may include a plurality of third electrodes 564 interleaved with a plurality of fourth electrodes 566. The third electrodes 564 may be connected with the first active termination 104 (FIG. 1A) and the fourth electrodes 556 may be connected with the second active termination 106 (FIG. 1A).

The third region 556 may include an electrode stack-up including a cross-shaped electrode 568, a first electrode 570, and a second electrode 572, for example as described above with reference to FIGS. 3A through 3C.

Figure 6A:
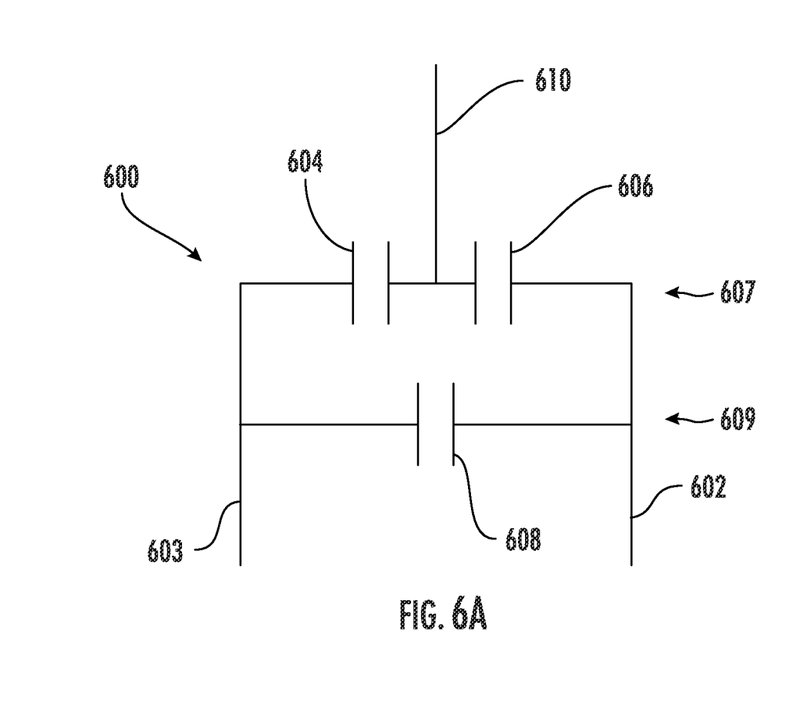
FIG. 6A illustrates a schematic view of the device of FIG. 5A.

FIG. 6A illustrates a schematic view 600 of the device 500 of FIG. 5A. More specifically, the device 500 may include active leads 602, 603. A first capacitor 604 and a second capacitor 606 may be formed in a first region 607, for example as described above with respect to FIG. 5A. A ground lead 610 may be connected at a location that is between the first and second capacitors 604, 606 (e.g., connected with the cross-shaped electrode 502 described above with reference to FIG. 5A). A third capacitor 608 may be electrically connected between the active leads 602, 603 and in parallel with the first and second capacitors 604, 606 in a second region 609, for example as described above with respect to FIG. 5A.

Figure 6B:
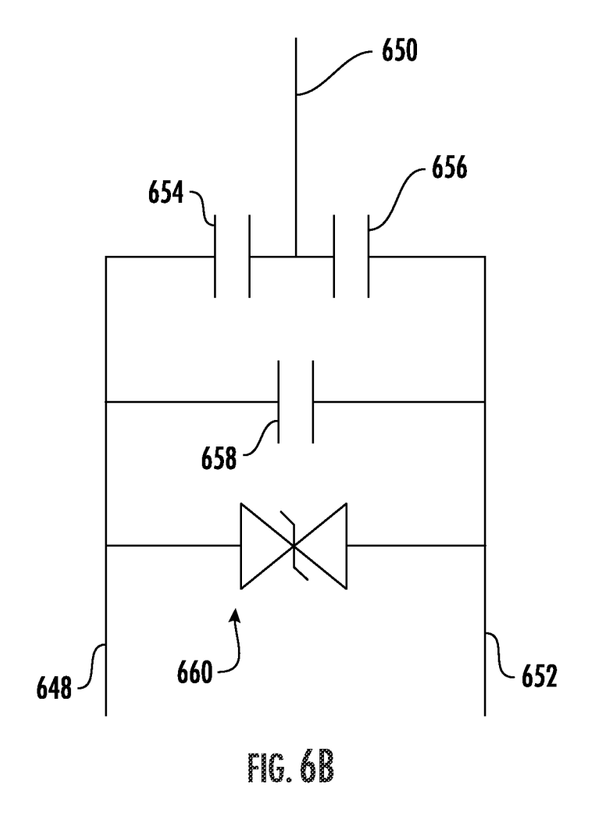
FIG. 6B illustrates a schematic view of the device of FIG. 5B.

FIG. 6B illustrates a schematic view 650 of the device 550 of FIG. 5B. The device 550 may be generally configured similarly to the device 500 of FIG. 5A. In addition, a varistor 660 may be connected between the active leads 648 and 652 and in parallel with the capacitors 654, 656, 658.

Figure 7:
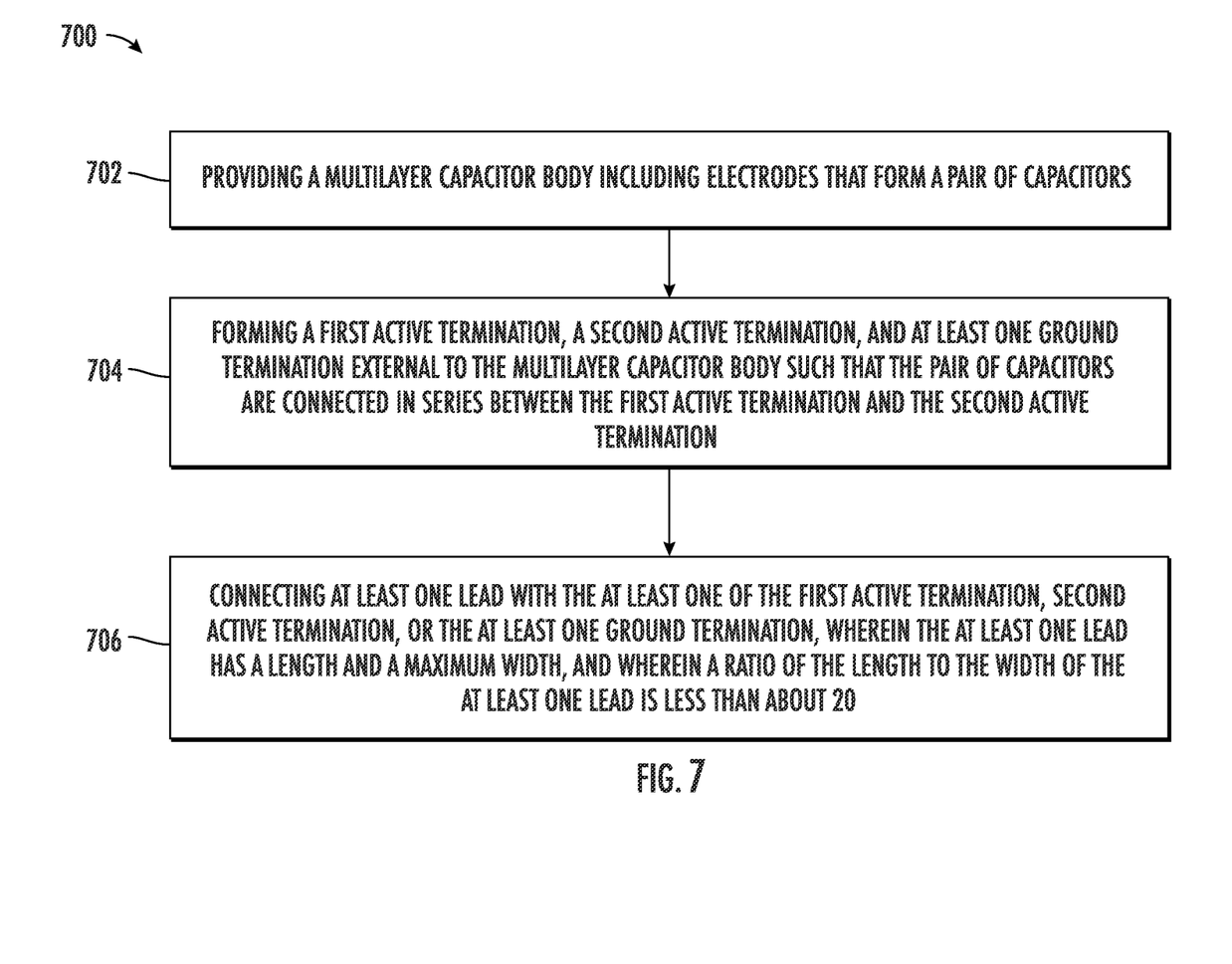
FIG. 7 is a flowchart of a method for forming a low inductance component in accordance with presently disclosed subject matter.

FIG. 7 is a flowchart of a method 700 for forming a low inductance component. In general, the method 700 will be described herein with reference to the components 100, 200 of FIGS. 1A and 2. However, it should be appreciated that the disclosed method 700 may be implemented with any suitable component. In addition, although FIG. 7 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method 700 may include, at (702), providing a multilayer capacitor body including electrodes that form a pair of capacitors, for example as described above with reference to FIGS. 1A through 6B.

The method 700 may include, at (704), forming a first active termination, a second active termination, and at least one ground termination external to the multilayer capacitor body such that the pair of capacitors are connected in series between the first active termination and the second active termination, for example as described above with reference to FIGS. 1A through 6B.

The method 700 may include, at (706), connecting at least one lead with the at least one of the first active termination, second active termination, or the at least one ground termination. The lead(s) may have respective lengths and maximum widths. A ratio of a length to a respective width of at least one of leads (if more than one lead is present) may be less than about 20.

It should be understood that individual steps in achieving the disclosed configurations are only intended as representative thereof, and do not denote required use of other aspects beyond the general nature of the disclosure otherwise indicated. For example, those of ordinary skill in the art will recognize that selected steps may be practiced to produce a particular design selected for a given application of the presently disclosed subject matter.

While such presently disclosed subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the presently disclosed subject matter as would be readily apparent to one of ordinary skill in the art.

What is claimed is:

1. A low inductance component comprising:
   a multilayer, monolithic device comprising a first active termination, a second active termination, at least one ground termination, and a capacitor; and
   at least one lead coupled with at least one of the first active termination, the second active termination, or the at least one ground termination, wherein the at least one lead has a length and a maximum width, and wherein a ratio of the length to the maximum width of the at least one lead is less than about 20.

2. The low inductance component of claim 1, wherein the at least one lead has an approximately rectangular cross section, the approximately rectangular cross section having the maximum width in a first direction and a minimum width in a second direction that is perpendicular to the first direction.

3. The low inductance component of claim 2, wherein a ratio of the maximum width to the minimum width is greater than about 2.

4. The low inductance component of claim 1, wherein the at least one lead comprises a first active lead, a second active lead, and at least one ground lead connected, respectively, with the first active termination, the second active termination, and the at least one ground termination.

5. The low inductance component of claim 1, further comprising a discrete varistor comprising a first external varistor termination and a second external varistor termination, and wherein the at least one lead comprises a first lead coupled with each of the first active termination and the first external varistor termination.

6. The low inductance component of claim 1, wherein the at least one lead comprises a plurality of woven elongated conductive members.

7. The component of claim 5, wherein the capacitor is a pair of capacitors including a first capacitor and a second capacitor, and wherein the multilayer, monolithic device further comprises:
   a body comprising a plurality of dielectric layers;
   a first plurality of electrode layers disposed within the body and connected with the first active termination;
   a second plurality of electrode layers disposed within the body and connected with the second active termination; and
   a third plurality of electrode layers connected with the at least one ground termination and capacitively coupled with each of the first plurality of electrode layers and second plurality of electrode layers to form the first capacitor between the first plurality and third plurality of electrode layers and the second capacitor between the second plurality and third plurality of electrode layers.

8. The component of claim 7, wherein the third plurality of electrode layers are generally cross-shaped.

9. The component of claim 7, wherein the at least one ground termination comprises a first ground termination and a second ground termination.

10. The component of claim 9, wherein each of the third plurality of electrode layers each comprise a pair of opposite edges, one of the opposite edges connected with the first ground termination and the other of the opposite edges connected with the second ground termination.

11. The component of claim 9, wherein the first ground termination is located opposite the second around termination.

12. The component of claim 7, wherein the first capacitor has a first capacitance and the second capacitor has a second capacitance that is approximately equal to the first capacitance.

13. The component of claim 12, wherein at least one of the first capacitance or the second capacitance ranges from about 10 nF to about 3 µF.

14. The component of claim 7, wherein;
the third plurality of electrode layers overlap with the first plurality of electrode layers along a first overlapping area; and
the third plurality of electrode layers overlap with the second plurality of electrode layers along a second overlapping area that is approximately equal to the first overlapping area.

15. The component of claim 5, wherein the discrete varistor is stacked relative to the multilayer, monolithic device.

16. The component of claim 5, further comprising an over-molded layer encapsulating the discrete varistor and multilayer, monolithic device.

17. The component of claim 7, wherein a ratio of a thickness of the electrode stack-up to a thickness of the monolithic body is greater than about 0.4.

18. The component of claim 7, further comprising a fourth plurality of electrodes connected with the first external termination and a fifth plurality of electrodes connected with the second external termination and interleaved with the fourth plurality of electrodes to form a third capacitor.

19. A method for forming a low inductance component, the method comprising:
providing a multilayer, monolithic device body including electrodes that form a capacitor;
forming a first active termination, a second active termination, and at least one ground termination external to the multilayer, monolithic device body; and
connecting at least one lead with at least one of the first active termination, the second active termination, or the at least one ground termination, wherein the at least one lead has a length and a maximum width, and wherein a ratio of the length to the width of the at least one lead is less than about 20.

* * * * *